United States Patent [19]
Vice

[11] Patent Number: 5,361,409
[45] Date of Patent: Nov. 1, 1994

[54] FET MIXER HAVING TRANSMISSION LINE TRANSFORMER

[75] Inventor: Michael W. Vice, El Granada, Calif.

[73] Assignee: Watkins Johnson Company, Palo Alto, Calif.

[21] Appl. No.: 4,234

[22] Filed: Jan. 14, 1993

Related U.S. Application Data

[63] Continuation of Ser. No. 668,248, Mar. 12, 1991, abandoned.

[51] Int. Cl.$^5$ ............................................... H04B 1/26
[52] U.S. Cl. ............................... 455/326; 455/333; 333/119; 327/113
[58] Field of Search ............... 455/323, 326, 327, 330, 455/292, 332, 333; 333/24 R, 245, 246, 25, 26, 117, 119; 307/529

[56] References Cited

U.S. PATENT DOCUMENTS

| | | | |
|---|---|---|---|
| 4,675,911 | 6/1989 | Sokolov et al. | 455/333 |
| 4,979,233 | 12/1990 | Kawahata | 455/326 |
| 5,060,298 | 10/1991 | Waugh et al. | 455/326 |
| 5,280,648 | 1/1994 | Dobrovolny | 455/333 |

*Primary Examiner*—Edward F. Urban
*Attorney, Agent, or Firm*—Flehr, Hohbach, Test, Albritton & Herbert

[57] ABSTRACT

A mixer comprising four FET transistors in a MMIC, a reflection transformer having tri-filar windings, an IF balun, an RF balun, a local oscillator balun, a pair of load resistors, a pair of series resistors, and a pair of series capacitors. The mixer is packaged in a lidded header similar to a large TO-8 metal package.

11 Claims, 3 Drawing Sheets

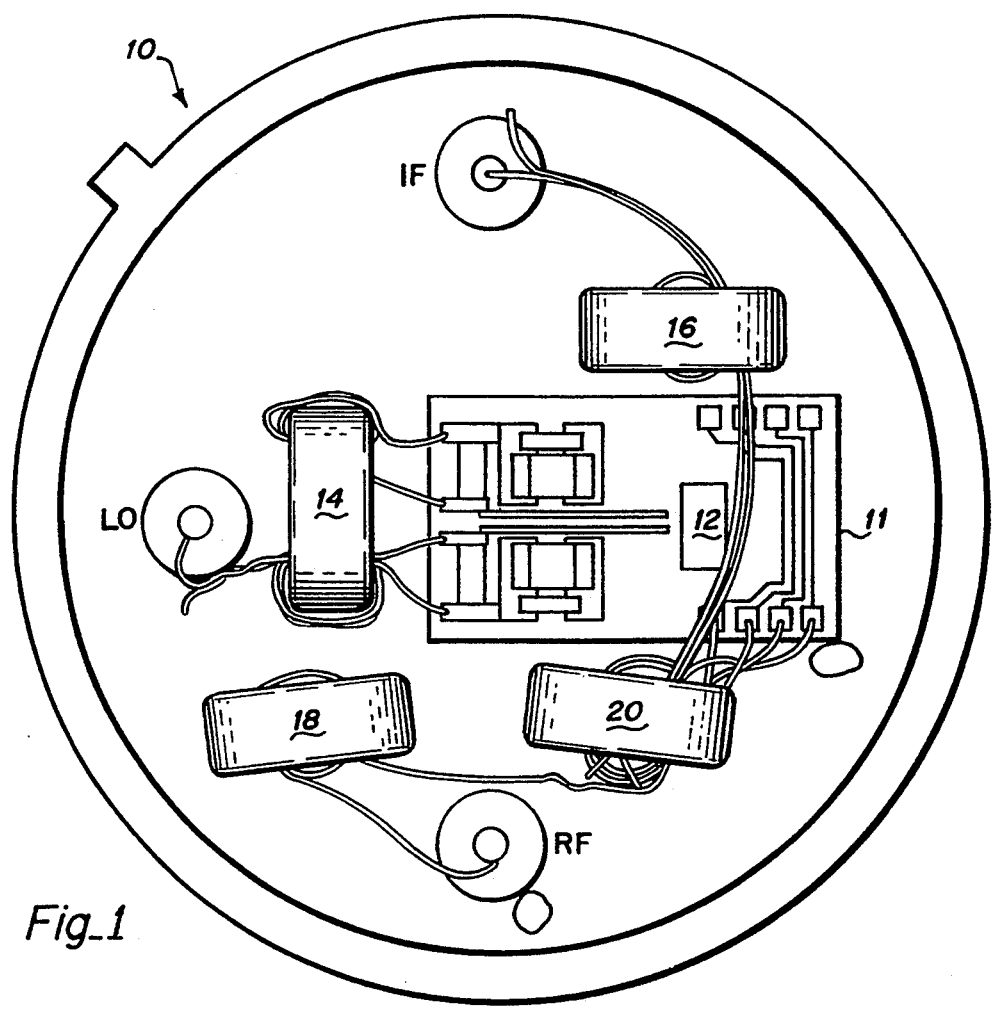
Fig_1
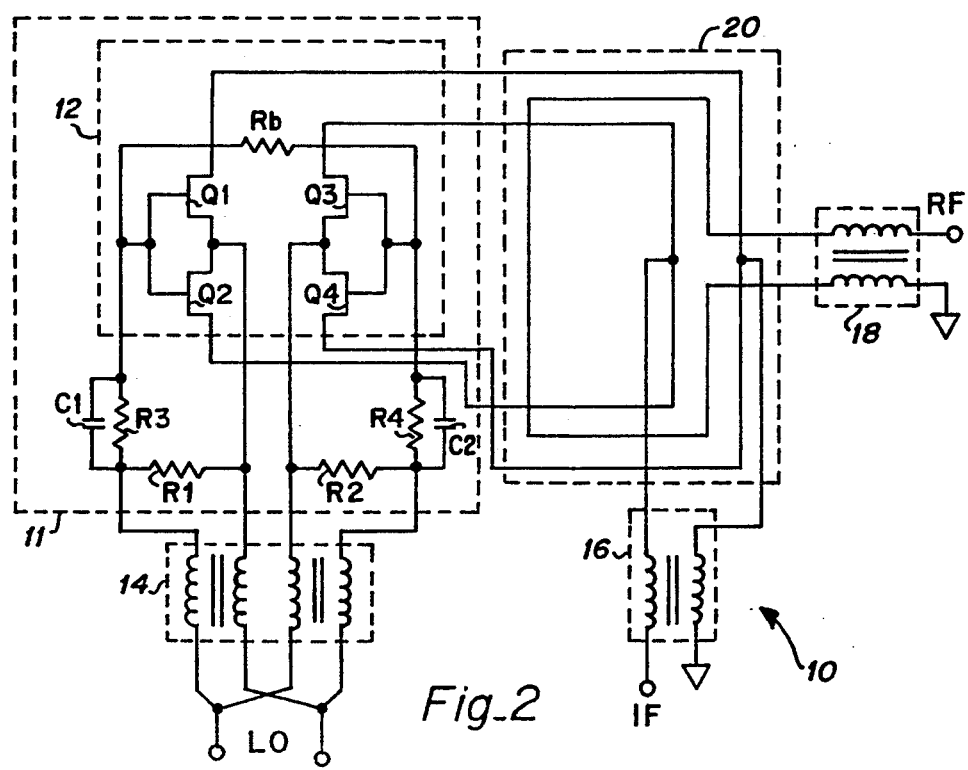
Fig_2

FET MIXER HAVING TRANSMISSION LINE TRANSFORMER

This is a continuation of application(s) Ser. No. 07/668,248 filed on Mar. 12, 1991, now abandoned.

BACKGROUND OF THE INVENTION

1. Field of the Invention

The invention relates generally to radio frequency communication devices and more specifically to mixers requiring relatively low local oscillator power levels and having high third order intercepts.

2. Description of the Prior Art

The dynamic range of many prior art microwave front-ends is controlled by the single and two-tone intermodulation levels of a Schottky diode mixer. (S. Weiner, D. Neuf, S. Spohrer, "2 to 8 GHZ Double Balanced MESFET Mixer With +30 dBm Input 3rd Order Intercept," 1988 *IEEE MTT-S Digest.*, pp. 1097–1099.) A typical Schottky mixer obtains third order intercept points approximately equal to the local oscillator (LO) power minus the conversion loss plus 10-dB. The popular diode-ring double-balanced mixer often requires the LO power to exceed the signal compression level by 6-dB. Trade-offs between LO power levels and third order intercept and one dBm compression points are inevitable, even in multiple diode schemes attempting to improve isolation, bandwidth, and single-tone intermodulation levels. Low distortion mixing is known to be possible with small amounts of LO power when an unbiased channel of a GaAs MESFET is used as the mixing element. (See, Stephen A. Maas, "A GaAs MESFET Balanced Mixer With Very Low Intermodulation," 1987 *IEEE MTT-S Digest*, pp. 895–896.) Weiner, et al., describe both single and double balanced mixers that use GaAs MESFETs instead of diodes. These mixers operate over a two to eight GHz range and obtain third order intercepts greater than +28 dBm at an LO power input of +23 dBm, with typical conversion loss of 8-dB, and an LO to radio frequency (RF) isolation greater than 25-dB. Weiner, et al., explain that previous designs using MESFETs had been limited by the LO balun and. intermediate frequency transformer. These limitations were overcome by using a ring of GaAs MESFETs and tapered microstrip baluns in novel single and double balanced configurations to achieve multi-octave bandwidths. However, the bandwidth of these units is limited by the MESFET package parasitic reactances used in the ring. Weiner, et al., indicate that their future experiments will include a monolithic MESFET Quad with special gate geometry designed to improve the third order distortion, and wire-bonding of the FET to an alumina substrate to minimize parasitic reactances.

The Siliconix Si8901-DBM is a monolithic quad-MOSFET ring demodulator/mixer that is reported to achieve third-order intercepts exceeding +37 dBm and 2-dB signal overload compression and desensitization of +30 dBm at a LO drive level of +17 dBm (50 mW). (Ed Oxner, "high dynamic range mixing with the Si8901," March 1988, pp. 10–11.) The Si8901 comes in a hermetic TO-99 package and a surface mount SO-14 package. The Si8901 commutation-mixer relies on the switching action of the quad-MOSFET elements to effect a mixing action. The MOSFETs act, essentially, as a pair of switches reversing the phase of a signal at a rate determined by the LO frequency. The MOSFETs exhibit a finite on-resistance that is expressed as a conversion efficiency loss. The loss results from the $r_{ds(on)}$ of the MOSFETs relative to both the signal and IF impedances and signal conversion to unwanted frequencies.

SUMMARY OF THE PRESENT INVENTION

It is therefore an object of the present invention to produce a radio frequency mixer that has a wide dynamic range of operation and low overall signal distortion.

Briefly, a mixer of the present invention comprises four GaAs MESFET transistors in a MMIC, a "reflection" transformer having tri-filar windings, an IF balun, an RF balun, a local oscillator balun, a pair of load resistors, a MESFET bias resistor within the MMIC, and a pair of series capacitors. The mixer is packaged in a TO-8 metal package.

An advantage of the present invention is that an improved dynamic signal range is exhibited.

Another advantage of the present invention is that lower distortion results in the intermediate frequency signal.

Another advantage of the present invention is that the third order two tone intercept point is substantially better than a diode mixer for identical levels of local oscillator drive.

These and other objects and advantages of the present invention will no doubt become obvious to those of ordinary skill in the art after having read the following detailed description of the preferred embodiments which are illustrated in the various drawing figures.

IN THE DRAWINGS

FIG. 1 is a top elevational view of a mixer of the present invention constructed inside a metal TO-8 transistor package;

FIG. 2 is a schematic diagram of the mixer of FIG. 1;

DETAILED DESCRIPTION OF THE PREFERRED EMBODIMENTS

Figure 3:
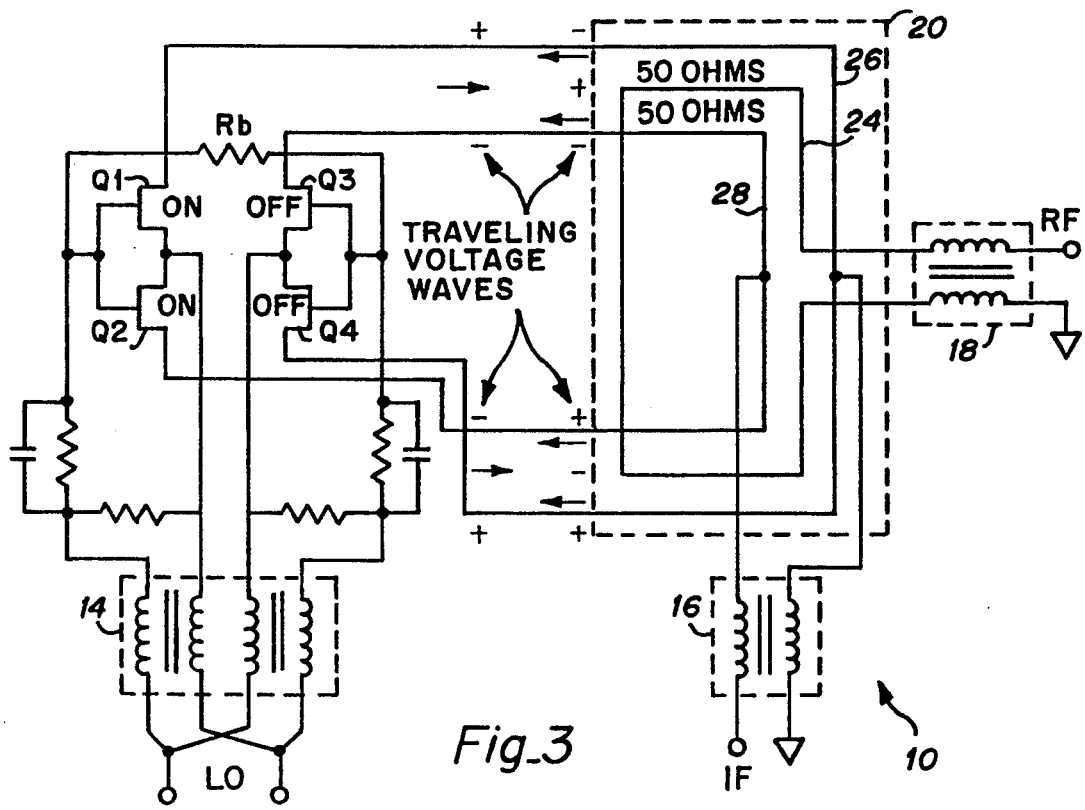
FIG. 3 is a schematic diagram of the traveling waves incident to and reflected from the MMIC in a first state.

FIG. 1 illustrates a mixer of the present invention, referred to by the general reference numeral 10, comprising a substrate 11 having a MMIC 12, a local oscillator (LO) balun 14, an intermediate frequency (IF) balun 16, a radio frequency (RF) balun 18, and a reflection transformer 20 all mounted in an industry standard TO-8 transistor "flat pack" hermetic Kovar package. Transformer 20 is referred to as a "reflection transformer," and such a term is new to the art. A reflection transformer is defined herein to mean any transmission line transformer that relies on a nearly complete reflection of energy at some reference plane of the transformer to achieve substantially complete coupling between its two or more distinct terminals or ports. The reflection transformer 20 comprises trifilar windings on a two-hole ferrite core or torroid, as shown in FIG. 1.

Referring to FIG. 2, substrate 11 comprises two 100Ω thick film resistors labelled R1 and R2, two capacitors C1 and C2, and two 500Ω resistors R3 and R4. MMIC 12 comprises four GaAs MESFET transistors Q1, Q2, Q3, and Q4, and preferably has a 5KΩ resistor Rb connected between the gates of Q1 and Q2 and the gates of Q3 and Q4. Resistors R3 and R4 are intended to aid in the development of an optimum DC bias on the gates of transistors Q1, Q2, Q3, and Q4. If resistor Rb is included in MMIC 12, resistors R3 and R4 can be eliminated. A DC bias voltage will self-develop in transistors Q1, Q2, Q3, and Q4 by virtue of a small, but significant, amount of intentional forward-biased gate current.

Figure 4:
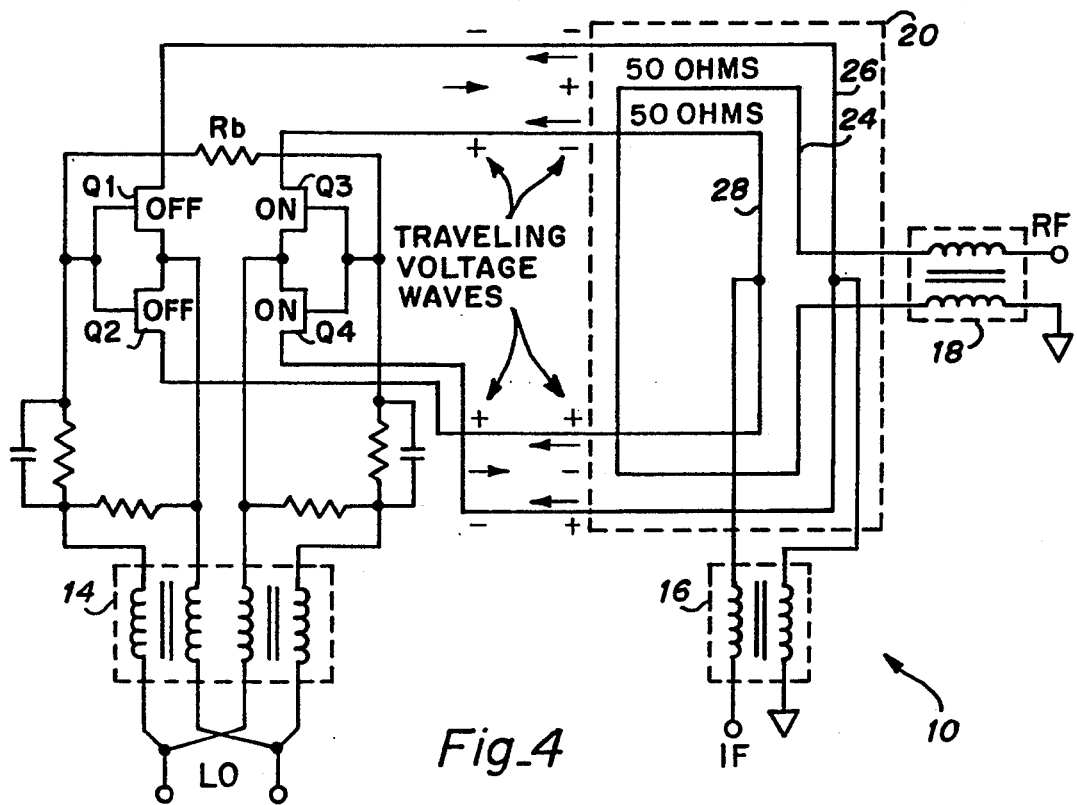
FIG. 4 is a schematic diagram of the traveling waves incident to and reflected from the MMIC in a second state opposite to the first.

FIGS. 3 and 4 illustrate the switching action of transistors Q1, Q2, Q3, and Q4 in response to a LO signal input. LO balun 14 will present a 50Ω impedance to the LO because resistors R1 and R2 are seen in parallel and represent the principal components of the input impedance. LO balun 14 is wound such that the LO signal is 180° out of phase between the gates of Q1 and Q2 and the gates of Q3 and Q4. Transistors Q1, Q2, Q3, and Q4 do not operate in their linear regions for any significant time and will either be fully ON or fully OFF. FIG. 3 illustrates when Q1 and Q2 are ON and Q3 and Q4 are OFF. FIG. 4 illustrates the opposite condition when Q1 and Q2 are OFF and Q3 and Q4 are ON. Either way, transistors Q1, Q2, Q3, and Q4 will not present a 50Ω impedance to reflection transformer 20. Incoming RF signals from RF balun 18 will cause a winding 24 to induce a signal into a pair of windings 26 and 28. These signals travel out reflection transformer on both top and bottom branches of windings 26 and 28 to transistors Q1, Q2, Q3, and Q4, where they then reflect back to the mid-point where IF balun 16 taps into reflection transformer 20. The nature of the signals seen by IF balun 16 will depend on whether transistor pair Q1 and Q2 are ON or transistor pair Q3 and Q4 are ON. (If Q1 and Q2 are ON, Q3 and Q4 must be OFF, and vice versa.) The LO input signal is therefore caused to beat against the RF input signal with the products (RF, LO, RF−LO, and RF+LO) appearing as the IF output signal. (The RF and LO product terms are considerably suppressed by virtue of the balanced topology and are therefore insignificant.) Mixer 10 has a very high third-order two-tone intercept point. (Those skilled in the art will be familiar with the use of the third-order two-tone intercept point as a measure of a figure of merit for a mixer.)

Figure 5:
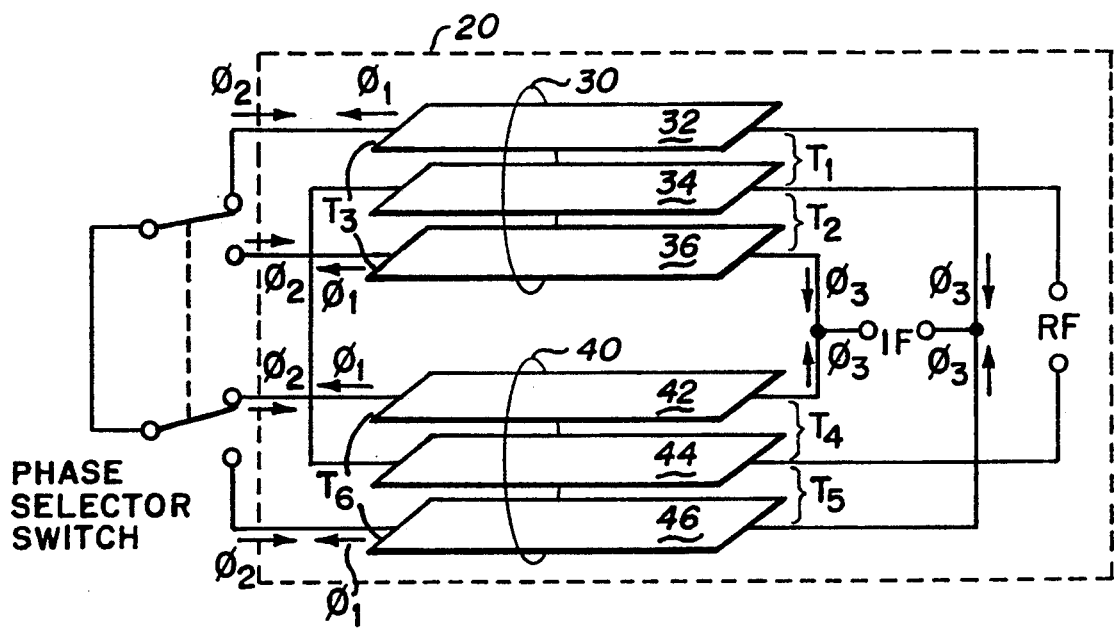
FIG. 5 is a schematic diagram of the reflection transformer and emphasizes the transmission line segment nature of the trifilar windings.

FIG. 5 illustrates a conceptual view of the reflection transformer 20 as comprising six transmission line segments $T_1$–$T_6$. A trifilar wire 30 comprises three individual wires 32, 34, and 36. Transmission line segment $T_1$ is comprised of wires 32 and 34, and transmission line segment $T_2$ is comprised of wires 34 and 36. Wires 32 and 36 comprise transmission line segment $T_3$. A trifilar wire 40 comprises three individual wires 42, 44, and 46. Transmission line segment $T_4$ is comprised of wires 42 and 44, and transmission line segment $T_5$ is comprised of wires 44 and 46. Wires 42 and 46 comprise transmission line segment $T_6$. For purposes of explanation only, a phase selector switch in FIG. 5 replaces the quad-MESFET of FIGS. 2–4 at a phase switching port of transformer 20. The input signals are applied at an RF port and output is taken at an IF port. (The labels "RF port" and "IF port" owe their relevance to the mixer application of the reflection transformer and can alternatively be replaced by the labels "primary port" and "secondary port," respectively.) The several transmission lines $T_1$–$T_6$ behave in the manner shown in Table I.

TABLE I

| T | Z | $\phi_1$ | $\phi_2$ | $\phi_3$ |
|---|---|---|---|---|
| $T_1$ | $Z_0$ | 0° | 180° | 180° |
| $T_2$ | $Z_0$ | 0° | 0° | 0° |
| $T_3$ | $2Z_0$ | | | |
| $T_4$ | $Z_0$ | 180° | 180° | 0° |
| $T_5$ | $Z_0$ | 180° | 0° | 180° |
| $T_6$ | $2Z_0$ | | | |

Each transmission line $T_1$–$T_6$ has a characteristic impedance equal to the system impedance of $Z_0$ (preferably 50Ω) or equal to two times $Z_0$. The combined parallel impedance of $T_1$ and $T_2$ (and also $T_4$ and $T_5$) is $Z_0/2$, which is the correct impedance for an ordinary balanced transformer of this type. The combined series impedance of these lines is $2Z_0$, which gives $Z_0$ when combined at the IF port. Thus, the transformer is matched to a system impedance of $Z_0$ at both the RF and IF ports. The incident wave relative phase angle at the phase switching port is represented by $\phi_1$ and is expressed in degrees. The reflected wave relative phase angle at the phase switching port is represented by $\phi_2$ and is expressed in degrees. The resultant relative phase angle at the IF output port is represented by $\phi_3$ and is also expressed in degrees.

Figure 6:
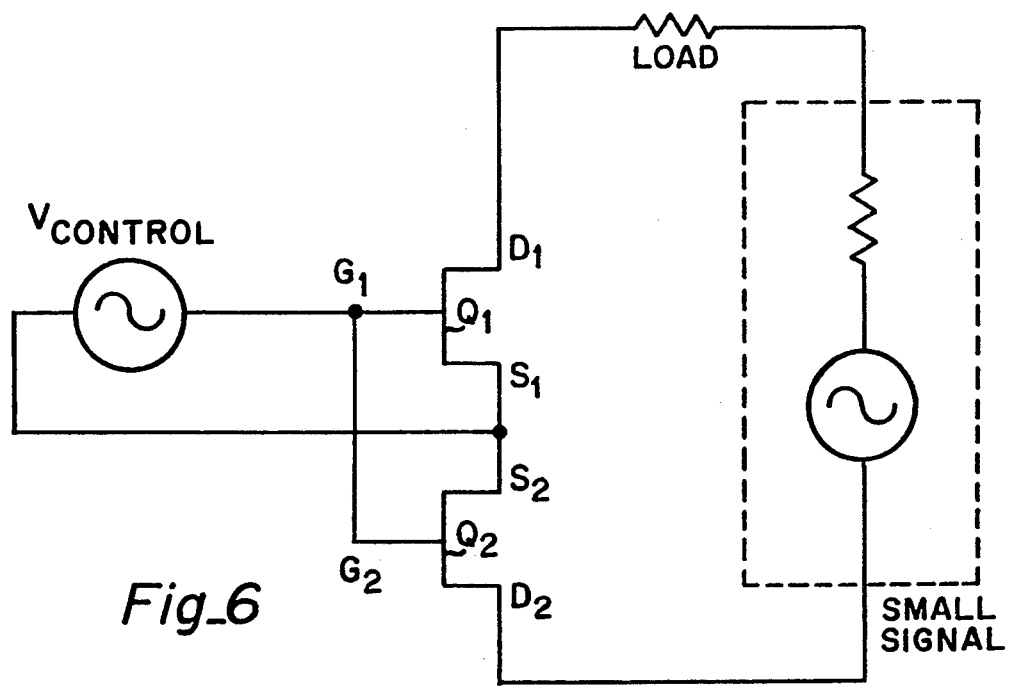
FIG. 6 is a schematic of a pair of back-to-back FETs used as a model to explain how the present invention reduces intermodulation distortion in the preferred embodiment.

FIG. 6 illustrates how back-to-back FETs help cancel intermodulation distortion. For the circuit of FIG. 6:

$V_{g_1s_1} = V_{control}$
$V_{g_2s_2} = V_{control}$
$V_{g_1d_1} = V_{g_1s_1} + V_{s_1d_1}$
$V_{g_2d_2} = V_{g_2s_2} + V_{s_2d_2}$ To a first approximation, $V_{s_1d_1} = -V_{s_2d_2}$. Also, to a first approximation, $\Delta R_{ds} = c\, \Delta V_{gd}$, which says that the channel resistance is linear to gate bias. This assumption is nearly correct during the time that the FETs are heavily conductive.

Let $Rd_1d_2$ be the total series resistance of the FETs, and $\Delta Rd_1d_2$ be that component of the channel resistance causing intermodulation distortion. Then, $$\begin{aligned}\Delta Rd_1d_2 &= c(\Delta V_{g_1d_1} + \Delta V_{g_2d_2}) \\ &= c(V_{s_1d_1} + V_{s_2d_2}) \\ &= 0\end{aligned}$$

The small signal passes through the FET channel combination without controlling its resistance. This condition is equivalent to infinite intermodulation suppression. This is the technique used in mixer 10 to help reduce intermodulation distortion.

Although the present invention has been described in terms of the presently preferred embodiments, it is to be understood that the disclosure is not to be interpreted as limiting. Various alterations and modifications will no doubt become apparent to those skilled in the art after having read the above disclosure. Accordingly, it is intended that the appended claims be interpreted as covering all alterations and modifications as fall within the true spirit and scope of the invention.

What is claimed is:

1. A mixer comprising:
   a first and a second FET transistor each having a gate and a drain and a source, the first and second FET transistors having their gates tied to one another and said sources connected together such that the first and second FET transistors are in series;

a third and a fourth FET transistor each having a gate and a drain and a source the third and fourth FET transistors having their gates tied to one another and said sources connected together such that the third and fourth FET transistors are in series and isolated from the first and second FET transistors;

a bias resistor connected between said gates of the first and second FET transistors and said gates of the third and fourth FET transistors;

a local oscillator (LO) balun having a first and a second output port for connection to said gates and sources of the first through fourth FET transistors such that the first and second FET transistors are driven on and off opposite to the third and fourth FET transistors and an unbalanced input port for connection to an external local oscillator source;

a first capacitor connected in series with said first output port of the LO balun and with said gates belonging to the first and second FET transistors;

a second capacitor connected in series with said second output port of the LO balun and with said gates belonging to the third and fourth FET transistors; and a reflection transformer coupled to said drains of said first, second, third and fourth FET transistors, said reflection transformer comprising a transmission line transformer having at least two ports, said ports connected such that nearly complete coupling of a signal between said ports relies on substantially complete reflection of energy at a reference plane of the transformer, said reference plane being defined by said first, second, third and fourth FET transistors.

2. The mixer of claim 1, wherein:
the reflection transformer comprises a radio frequency (RF) input port for connection to an external radio frequency source, a four-wire switch port, and an intermediate frequency (IF) output port, said four-wire switch port connected to said drains of the first, second, third, and fourth FET transistors.

3. The mixer of claim 1, wherein:
the reflection transformer comprises trifilar windings on a two-hole ferrite core or toroid.

4. The mixer of claim 1, wherein:
the LO balun and said ports of the reflection transformer have characteristic impedances of approximately fifty ohms.

5. The mixer of claim 1, further comprising;
a metal hermetic package in which substantially all of the components of the mixer are encased.

6. The mixer of claim 1, further comprising:
an alumina ceramic substrate subjacent first FET, said second FET, said third FET, said fourth FET, and said bias resistor.

7. The mixer of claim 6, wherein:
the first, second, third, and fourth FET transistors comprise a GaAs MESFET MMIC device mounted to the alumina substrate.

8. The mixer of claim 1, further comprising:
a radio frequency (RF) balun for matching the impedance of an RF source to the reflection transformer.

9. The mixer of claim 1, further comprising:

an intermediate frequency (IF) balun for matching the impedance of the reflection transformer to an IF output.

10. The mixer of claim 1, further comprising;
a hermetic Kovar package in which substantially all of the components of the mixer are encased, the package conforming to an industry standard flat pack.

11. A mixer comprising:
a first and a second FET transistor each having a gate and a drain and a source, the first and second FET transistors having their gates tied to one another and said sources of the first FET transistor connected to said drain of the second FET transistor;

a third and a fourth FET transistor each having a gate and a drain and a source, the third and fourth FET transistors having their gates tied to one another and said source of the third FET transistor connected to said source of the fourth FET transistor;

a bias resistor connected between said gates of the first and second FET transistors and said gates of the third and fourth FET transistors;

a local oscillator (LO) balun having a first and a second output port and an unbalanced input port;

a first capacitor connected in series with said first output port of the LO balun and with said gates belonging to the first and second FET transistors;

a second capacitor connected in series with said second output port of the LO balun and with said gates belonging to the third and fourth FET transistors; and a reflection transformer coupled to said first, second, third and fourth FET transistors, said reflection transformer comprising a transmission line transformer having at least two ports, said ports connected such that nearly complete coupling of a signal between said ports relies on substantially complete reflection of energy at a reference plane of the transformer defined by said first, second, third and fourth FET transistors, said transmission line transformer having a system impedance of $Z_0$, the reflection transformer including a radio frequency (RF) port and an intermediate frequency (IF) port and comprises first through sixth transmission line segments, said first, second, fourth, and fifth transmission lines being coupled to said RF port and having a transmission line characteristic impedance of $Z_0$, said third and sixth transmission lines being coupled to said drains of said FET transistors and having a transmission line characteristic impedance of two times $Z_0$, said first transmission line being positioned such that a zero degree incident wave relative phase angle at said RF port and a 180° reflected wave relative phase angle at a phase switching port causes a resultant relative phase angle of 180° at said IF port said phase switching port being located at said reference plane, said second transmission line being positioned such that a zero degree incident wave relative phase angle at said RF port and a zero degree reflected wave relative phase angle at said phase switching port causes a resultant relative phase angle of zero degrees at said IF port;

said fourth transmission line being positioned such that a 180° incident wave relative phase angle at said RF port and a 180° reflected wave relative phase angle at said phase switching port causes a resultant relative phase angle of zero degrees at said IF port; and said fifth transmission line being positioned such that a 180° incident wave relative phase angle at said RF port and a zero degree reflected wave relative phase angle at said phase switching port causes a resultant relative phase angle of 180° at said IF port.

* * * * *

UNITED STATES PATENT AND TRADEMARK OFFICE
CERTIFICATE OF CORRECTION

PATENT NO. : 5,361,409

DATED : November 1, 1994

INVENTOR(S) : Michael W. Vice

It is certified that error appears in the above-indentified patent and that said Letters Patent is hereby corrected as shown below:

Column 4, Table 1: along the top, "$0_1$ $0_2$ $0_3$" should be $--\phi_1$ $\phi_2$ $\phi_3--$;

Column 4, Table 1: in column $\phi_2$ row $T_4$ the "180°" should be $--0°--$;

Column 4, Table 1: in column $\phi_2$ row $T_5$ the "0°" should be $--180°--$;

Column 5, line 5: after the word "source" insert a comma; and

Column 6, line 14: the word "drain" should be --source--.

Signed and Sealed this

Eighteenth Day of July, 1995

BRUCE LEHMAN

Attest:

Attesting Officer

Commissioner of Patents and Trademarks